Figure 1:
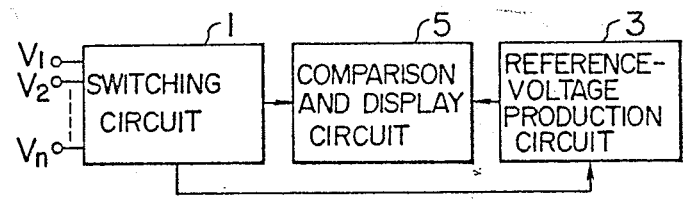

United States Patent [19]
Miyakawa

[11] 4,097,857
[45] Jun. 27, 1978

[54] APPARATUS FOR SELECTIVELY DISPLAYING ANALOGUE QUANTITIES OF PLURAL INPUT DATA SIGNALS

[75] Inventor: Nobuaki Miyakawa, Hitachi, Japan
[73] Assignee: Hitachi, Ltd., Japan
[21] Appl. No.: 685,697
[22] Filed: May 11, 1976
[30] Foreign Application Priority Data
   May 16, 1975 Japan ................. 50-57312
[51] Int. Cl.² ............................. G06F 3/14
[52] U.S. Cl. .................... 340/324 R; 340/166 EL
[58] Field of Search ....... 340/166 EL, 324 R, 324 M, 340/336

[56] References Cited
U.S. PATENT DOCUMENTS

| | | | |
|---|---|---|---|
| 3,130,348 | 4/1964 | Lieb | 340/336 |
| 3,824,581 | 7/1974 | Ohno | 340/166 EL |
| 3,914,758 | 10/1975 | Ingle | 340/336 |
| 3,987,392 | 10/1976 | Kugelmann et al. | 340/324 R |

*Primary Examiner* — Marshall M. Curtis
*Attorney, Agent, or Firm* — Craig & Antonelli

[57] ABSTRACT

A display apparatus receives analogue signals representing the detected values of the number of revolutions per minute of an automobile's engine, the residual fuel, the automobile's speed, the temperature at the various portions of the automobile and the like. An analogue signal desired for display is selected from those analogue signals by means of a switching device. The selected signal is applied to a common terminal. A plurality of light emitting diodes are connected between the common terminal and the terminals of a voltage-dividing device consisting of a plurality of resistors thereby to display the detected values.

2 Claims, 2 Drawing Figures

APPARATUS FOR SELECTIVELY DISPLAYING ANALOGUE QUANTITIES OF PLURAL INPUT DATA SIGNALS

The present invention relates to a display apparatus for displaying analogue quantities (input data) as the ratio of the analogue quantities to a predetermined value in the form of a graph. The display apparatus is adapted particularly to the instrument panel of vehicles such as automobiles for display of analogue values representing the number of revolutions per minute of an automobile's engine, the temperature at the various portions of the automobile, the residual fuel and the like.

For displaying the detected ratio of the analogue input value (input data) to a predetermined value, a conventional display apparatus uses a circuit for comparing input data and another circuit for displaying the comparison result of the input data. Since the conventional display apparatus is provided with the display circuit and the comparing circuit separately, it requires a number of circuit components which result in a high cost.

Accordingly, an object of the present invention is to provide a display apparatus with a simple circuit construction.

Another object of the present invention is to provide a display circuit with a comparing function.

Other object of the present invention is to provide a display device which can receive input data and select a desired one from the input data thereby to display it.

This invention provides a single-circuit arrangement capable of comparing the selected input data signal with the reference value predetermined and then displaying the result of the comparison, so that the circuit arrangement is simple in construction.

In more particular, a datum selected from the input data is applied to a first common terminal in the form of an analogue signal (voltage or current). In order to cause the corresponding number of the light emitting diodes to the analogue quantity of the selected input signal to light up, the light emitting diodes receive each reference step voltage, which stepwisely changes, at the one-side terminals in accordance with the order of the light emitting diodes set in array, while they receive at the other-side terminals the voltage which has been applied thereto and now appears at the first common terminal. Current flows through the light emitting diodes when they are forwardly biased by the potential difference appearing between the one-side terminals with the reference voltage applied thereto and the other-side terminals with the input data applied thereto, so that such biased light emitting diodes make a light-emission.

There are two ways for displaying the input data: One is that the number of light emitting diodes in light emitting state shows the analogue value of the input data; The other is that the number of light emitting diodes in light non-emitting state indicates the analogue value. The ways are selectable with which electrode of the light emitting diodes is connected between the terminals providing the reference step voltages and the first common terminal, i.e. which terminal the anode of the light emitting diode is connected to. The present invention permits either electrode of the light emitting diodes to be connectable to the common terminal. When the anode of the light emitting diode is connected to the common terminal, light is emitted from the light emitting diode of the number corresponding to the analogue value if the reference step voltage is positive. Conversely, in the case of the cathode of light emitting diode being connected to the common terminal, the light-emitting diodes of the number corresponding to the analogue value are turned off.

In this specification, the term "light emitting diode" is used to define a component which has at least two terminals and the impedance of which largely varies by the polarity of the voltage applied across the two terminals thereof and emits light when the current flowing therethrough reaches a predetermined value.

The components of the name other than the above which are now or will be commercially available, are also applicable to the display apparatus of the present invention if they have the above-mentioned characteristic. Thus, such components must also be involved in the above term of "light emitting diode".

Figure 2:
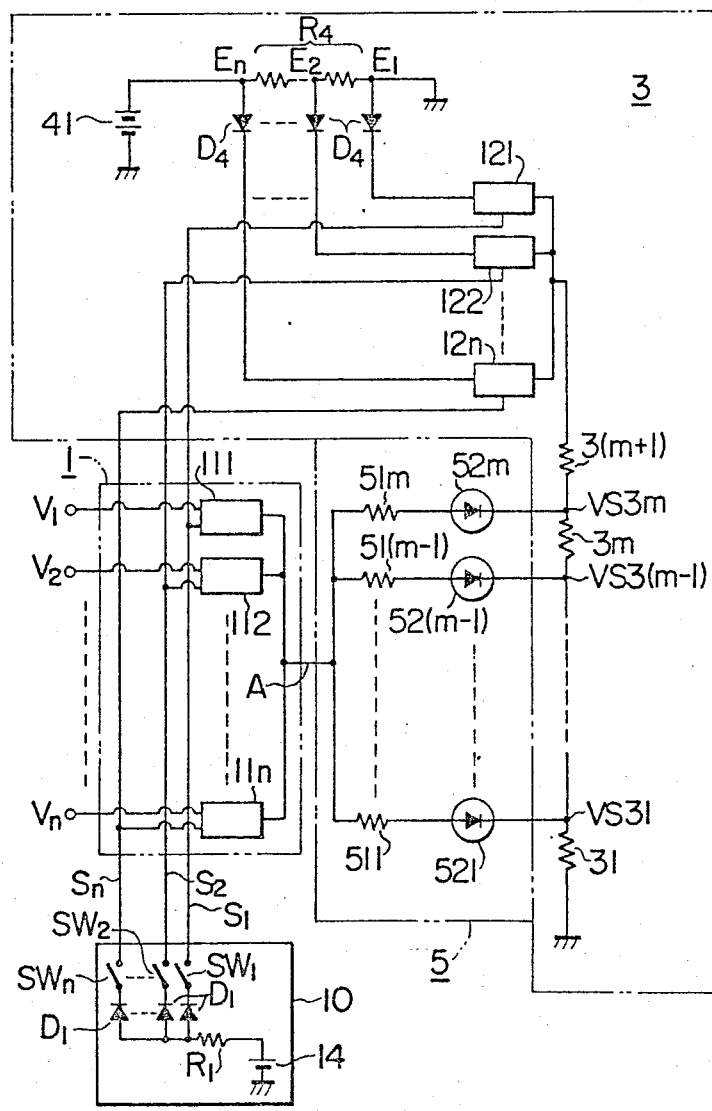

Other objects and features of the present invention will be apparent from the following description taken in connection with the accompanying drawings, in which:

FIG. 1 shows a block diagram of an embodiment of a display apparatus according to the present invention; and FIG. 2 shows a circuit diagram of a preferred embodiment of the block diagram of FIG. 1.

FIG. 1 shows a block diagram of a display apparatus of a preferred embodiment according to the present invention. In the figure, a switching circuit 1 selects one of input data $V_1$ to $V_n$. The selected input data is in turn transferred to a comparison and display circuit 5, while, at the same time, a signal for selecting the voltage determined by the selected input data is fed to a reference-voltage production circuit 3.

The comparison and display circuit 5 compares the input data voltage from the switching circuit 1 with the output voltage from the reference voltage production circuit 3. Through the comparing operation, when the input data voltage is larger than the output voltage of the reference voltage production circuit 3, the input data are displayed. When the above relationship in amplitude between the input data voltage and the reference output voltage is reversed, the input data are not displayed.

FIG. 2 shows a concrete construction for a preferred embodiment of the block diagram in FIG. 1. In FIG. 2, reference numeral 10 is a switching signal production circuit for producing switching signals S1 to Sn, 111 to 11n and 121 to 12n designate switches which are turned on and off in response to switching signals S1 to Sn, 31 to 3 (m + 1) and 511 to 51m are resistors, 521 to 52m designate light emitting diodes, and $E_1$ to $E_n$ are voltages determined by the input voltages $V_1$ to $V_n$.

The switches 111 to 11n receive at the input side the input voltages $V_1$ to $V_n$, while they are at the output side connected to a common terminal A. The common terminal A is connected to the anodes of the light emitting diodes 521 to 52m, through resistors 511 to 51m.

The switches 121 to 12n receive at the input side the voltages $E_1$ to $E_n$, and are at the output side connected in common to a series circuit consisting of resistors 31 to 3 (m + 1). The respective junction points of the resistors 31 to 3 (m + 1) are connected to the cathode sides of the light emitting diodes, respectively. It will be noted here that the voltages $E_1$ to $E_n$ are produced by a combination of, for example, a DC power source 41, resistors $R_4$, and diodes $D_4$. If the variable range of each of the input voltages representing the input data is iden- 1. An apparatus for selectively displaying analogue quantities of plural input data signals, comprising:
   a plurality of input means for receiving a corresponding plurality of input voltages of said data signals;
   first switching means having a plurality of input terminals connected to said input means and having an output terminal for selectively providing one of said input voltages;
   reference voltage generating means for generating a plurality of reference voltages corresponding to said data signals;
   second switching means having a plurality of input terminals connected to said reference voltage generating means and having an output terminal for selectively providing one of said reference voltages corresponding to said one of input voltages selected by said first switching means;
   voltage dividing means having an input terminal connected to said second switching means and having a plurality of output terminals, for dividing the selected one of reference voltages into a plurality of predetermined different voltages, and respective output terminals being provided for said respective predetermined different voltages;
   means for generating a plurality of switching signals for driving said first and second switching means and for selectively providing one of said switching signals to said first and second switching means; and
   display means including a plurality of light emitting diodes each connected between the output terminal of said first switching means and a respective output terminal of said voltage dividing means for providing a luminant display for the selected one of said input data signals.

2. An apparatus for selectively displaying analogue quantities of plural input data signals according to claim 1, wherein said voltage dividing means comprises a plurality of resistors connected in series, and said light emitting diodes are connected between the output terminal of said first switching means and respective junction points of said resistors.

* * * * *

United States Patent [19]
Gallant et al.

[11] 4,100,542
[45] Jul. 11, 1978

[54] MEASURING SYSTEM

[75] Inventors: John Henry Gallant, Upminster; Michael Robert Thomas Johnson, South Ockendon, both of England

[73] Assignee: May & Baker Limited, England

[21] Appl. No.: 647,156

[22] Filed: Jan. 7, 1976

Related U.S. Application Data

[62] Division of Ser. No. 429,692, Dec. 28, 1973, Pat. No. 3,953,803.

[30] Foreign Application Priority Data

Jan. 2, 1973 [GB] United Kingdom ............... 00218/73

[51] Int. Cl.² .............................................. H04Q 3/00
[52] U.S. Cl. ................................... 340/518; 340/151; 340/183
[58] Field of Search ................... 340/213 Q, 413, 151, 340/183

[56] References Cited

U.S. PATENT DOCUMENTS

| | | | |
|---|---|---|---|
| 3,150,253 | 9/1964 | Spergel | 340/213 Q |
| 3,495,074 | 2/1970 | Jacques | 340/413 |
| 3,641,530 | 2/1972 | Schoenwitz | 340/213 Q |
| 3,676,878 | 7/1972 | Linder | 340/413 |
| 3,721,969 | 3/1973 | Stewart | 340/151 |
| 3,855,456 | 12/1974 | Summers | 340/213 Q |

*Primary Examiner*—John W. Caldwell, Sr.
*Assistant Examiner*—James J. Groody
*Attorney, Agent, or Firm*—Stevens, Davis, Miller & Mosher

[57] ABSTRACT

A measuring system for measuring at a plurality of sampling points, a signal representative of the instantaneous value of a physical parameter, wherein a signal representative of the instantaneous value of the physical parameter being measured is utilized as a reference signal against which the next following signal is compared and so on. The system includes means for passing to an output, signals similar to, or within a predetermined limit of, the immediately preceding signals. A particular application of this measuring system is in the measurement of the temperature of living bodies wherein the changes in temperature are transmitted via a pulse width modulation telemetry system to a receiver incorporating the measuring system. By means of continually up-dating the reference signal it is possible to reject any signal which due to some reason such as radio interference is unacceptable because it varies too much from the previous reading.

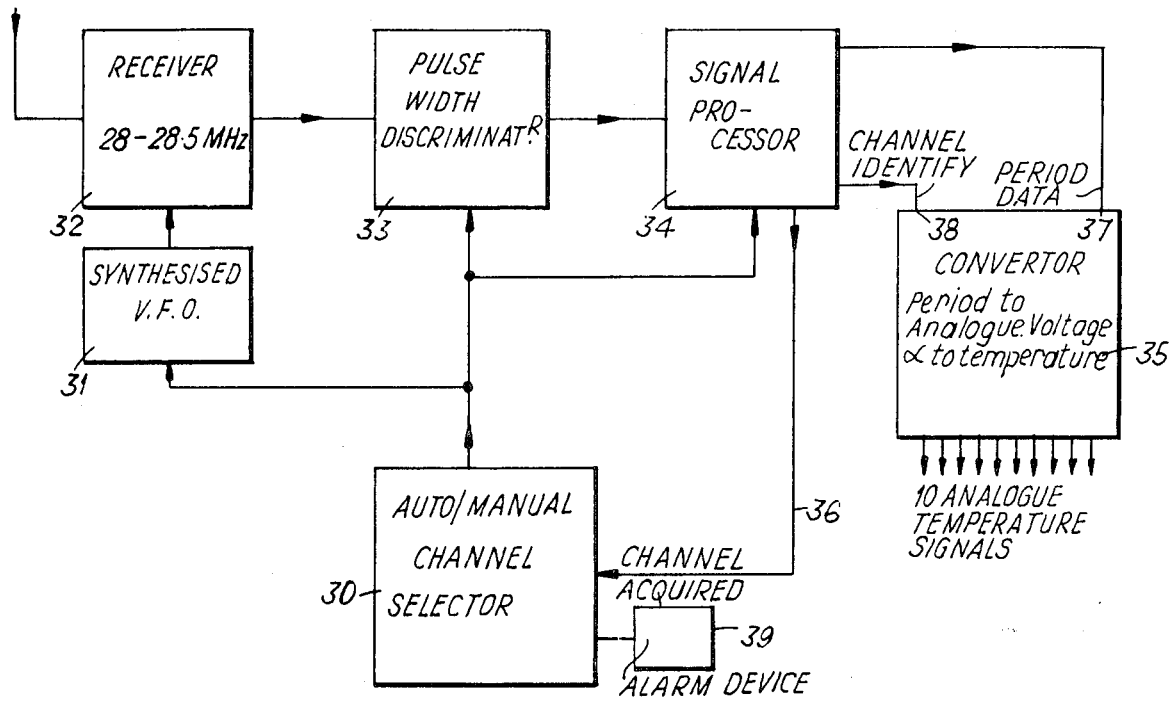

8 Claims, 6 Drawing Figures